(12) United States Patent
Aoki et al.

(10) Patent No.: US 10,017,655 B2
(45) Date of Patent: Jul. 10, 2018

(54) SILVER-CONTAINING COMPOSITION, AND BASE FOR USE IN FORMATION OF SILVER ELEMENT

(75) Inventors: Koichi Aoki, Kobe (JP); Eui-Chul Kang, Tsukuba (JP); Tatsuya Kozu, Tsukuba (JP); Toshinobu Fujimura, Chita-gun (JP)

(73) Assignee: NOF CORPORATION, Tokyo (JP)

( * ) Notice: Subject to any disclaimer, the term of this patent is extended or adjusted under 35 U.S.C. 154(b) by 719 days.

(21) Appl. No.: 14/413,962

(22) PCT Filed: Jul. 17, 2012

(86) PCT No.: PCT/JP2012/068133
§ 371 (c)(1),
(2), (4) Date: Jan. 9, 2015

(87) PCT Pub. No.: WO2014/013557
PCT Pub. Date: Jan. 23, 2014

(65) Prior Publication Data
US 2015/0203699 A1 Jul. 23, 2015

(51) Int. Cl.
C09D 11/52 (2014.01)
H01B 1/22 (2006.01)
(Continued)

(52) U.S. Cl.
CPC ............. C09D 11/52 (2013.01); C22C 5/06 (2013.01); H01B 1/02 (2013.01); H01B 1/22 (2013.01); H05K 1/097 (2013.01)

(58) Field of Classification Search
None
See application file for complete search history.

(56) References Cited

U.S. PATENT DOCUMENTS 4,915,955 A * 4/1990 Gomori ............... A01N 59/16
424/616
2010/0203333 A1 8/2010 Mokhtari et al.
(Continued)

FOREIGN PATENT DOCUMENTS

CN 101804458 A 8/2010
JP 3-231935 A 10/1991
(Continued)

OTHER PUBLICATIONS

European Patent Office, Communication dated Mar. 2, 2016 issued in corresponding Application No. 12881438.1.
(Continued)

Primary Examiner — Ling Siu Choi
Assistant Examiner — Thuy-Ai N Nguyen
(74) Attorney, Agent, or Firm — Sughrue Mion, PLLC

(57) ABSTRACT

Provided are a silver element containing silver acetonedicarboxylate with high silver content, and capable of providing a silver element with excellent electrical conductivity, flatness, and adhesivity through heating even for a short time at a low temperature of below the decomposition temperature of the silver salt, and having excellent storage stability, as well as a substrate having a silver element formed thereon with the composition. The composition is characterized by a particular ratio of silver compound (A) represented by formula (1) and amine compound (B) represented by formula (2):

(1)

(Continued)

-continued

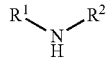

(2)

($R^1$: H, —$(CY_2)a$-$CH_3$, —$((CH_2)b$-O—CHZ)c-$CH_3$; $R^2$: —$(CY_2)d$-$CH_3$, —$((CH_2)e$-O—CHZ)f-$CH_3$, Y: H, —$(CH_2)g$-$CH_3$; Z: H, —$(CH_2)h$-$CH_3$; a: 0-8; b: 1-4; c: 1-3; d: 1-8; e: 1-4; f: 1-3; g: 1-3; h: 1-2).

4 Claims, 2 Drawing Sheets

(51) Int. Cl.
  *H05K 1/09* (2006.01)
  *C22C 5/06* (2006.01)
  *H01B 1/02* (2006.01)

(56) References Cited

U.S. PATENT DOCUMENTS

| | | |
|---|---|---|
| 2010/0247422 A1 | 9/2010 | Chung et al. |
| 2011/0315436 A1 | 12/2011 | Kim et al. |
| 2011/0318541 A1 | 12/2011 | Kim et al. |

FOREIGN PATENT DOCUMENTS

| | | |
|---|---|---|
| JP | 2004-315374 A | 11/2004 |
| JP | 2005-60824 A | 3/2005 |
| JP | 2005-200604 A | 7/2005 |
| JP | 2005-298921 A | 10/2005 |
| JP | 2007-145947 A | 6/2007 |
| JP | 2008-159535 A | 7/2008 |
| JP | 2009114232 A | 5/2009 |
| JP | 2009197133 A | 9/2009 |
| JP | 2010-123355 A | 6/2010 |
| JP | 2010-185140 A | 8/2010 |
| JP | 2011-506239 A | 3/2011 |
| JP | 2012-007140 A | 1/2012 |
| JP | 2012-007141 A | 1/2012 |

OTHER PUBLICATIONS

Von H. Paul et al., "Darstellung von Acetondicarbonsaure-di-tert-butyl-sowie-dibenzylester", Journal fur praktische Chemmie., 1970, pp. 240-244, Band 312.

International Searching Authority, International Search Report for PCT/JP2012/068133 dated Aug. 21, 2012.

International Searching Authority, International Preliminary Report on Patentability dated Jan. 20, 2015, mailed in counterpart International application No. PCT/JP2012/068133.

\* cited by examiner

SILVER-CONTAINING COMPOSITION, AND BASE FOR USE IN FORMATION OF SILVER ELEMENT

CROSS REFERENCE TO RELATED APPLICATIONS

This application is a National Stage of International Application No. PCT/JP2012/068133 filed Jul. 17, 2012, the content of which is incorporated herein by reference in its entirety.

FIELD OF ART

The present invention relates to a silver-containing composition which contains a silver salt with a high silver content and a stabilizer, and realizes formation of silver elements, such as silver metal films or lines, on a substrate, as well as a substrate having a silver element formed thereon which is obtained by heating the composition on the substrate surface.

BACKGROUND ART

There is known a method for forming a silver element, such as a metal thin film, on a substrate by applying or printing a liquid or paste ink containing metal particles on a substrate, followed by heating. The metal used here may be gold, silver, copper, or aluminum, with silver being generally used as a wiring material. Ink with silver usually contains silver metal dispersed in a solvent. The ink is patterned on an interconnection substrate, and silver metal in the ink is sintered to form wiring. It is known that, when used as an electrically conductive material, silver metal may be sintered at a lower temperature, making use of melting point depression caused by the fine size of the dispersed silver metal particles. On the other hand, silver metal particles of such a fine size as to cause melting point depression are prone to contact and aggregate with each other. For preventing aggregation, a dispersant is required in the ink (see, for example, Patent Publication 1).

Formation of a silver element with the ink containing a dispersant on a substrate by heating may result in residual impurities originated from the dispersant. In view of this, it is usually desired to remove the impurities by heating at a high temperature, such as 150° C. or higher.

A general method of forming a silver element on a substrate includes, for example, heating a silver salt composed of an inorganic acid and silver, such as silver nitrate, in the presence of a reducing agent and a dispersant. With this method, however, a residual acid component originated from the silver salt may result, and high-temperature heating is required for removal of the dispersant.

A method of forming a silver element with a silver salt containing an organic acid, instead of the inorganic acid, has also been reported. The organic silver proposed are, for example, silver salt of long-chain carboxylic acid (Patent Publication 2) or silver α-ketocarboxylate (Patent Publication 3).

However, quick decomposition of the organic silver calls for heating treatment at not lower than 150° C., and a low silver content of the organic silver causes difficulties in formation of a silver element with excellent flatness and adhesivity.

There have recently been made active attempts to form a silver element on a transparent resin substrate. A transparent resin substrate generally has a lower softening point compared to glass or the like, so that formation of a silver element on a transparent resin substrate is desirably made by a low-temperature heat treatment at lower than 150° C. The low-temperature heat treatment requires a lower thermal decomposition temperature of the silver salt. In view of this, silver β-ketocarboxylate of a particular structure is proposed which has a decomposition temperature of lower than 150° C. (Patent Publication 4).

However, this silver β-ketocarboxylate of a particular structure, which is a silver salt composed of a monofunctional carboxylic acid and silver, has a low silver content, and leaves a larger amount of residual organic component when heated. Thus, the resulting silver element provides low flatness and adhesivity to a substrate. On the other hand, decomposition and evaporation of the organic component requires long heating time, which lowers the production efficiency.

A silver salt composed of silver and malonic or oxalic acid has a higher silver content, as malonic and oxalic acids are dicarboxylic acids. However, decomposition of these silver salts in a short time requires high-temperature heating at not lower than about 210° C., so that the low-temperature heat treatment is hard to be realized.

There has been reported that silver acetonedicarboxylate, which is a dicarboxylate, may be used as an intermediate in the synthesis of an acetonedicarboxylate (Non-patent Publication 1).

This publication makes, however, no disclosure about the thermal decomposition characteristics of silver acetonedicarboxylate. In this regard, the thermal decomposability of silver acetonedicarboxylate, which has a higher silver content, was evaluated, to find that the thermal decomposition temperature was not lower than 150° C., which leads to an assumption that silver acetonedicarboxylate is hard to be used in a low-temperature sintering ink.

Patent Publication 1: JP-2005-60824-A
Patent Publication 2: JP-2005-298921-A
Patent Publication 3: JP-2004-315374-A
Patent Publication 4: JP-2008-159535-A
Non-patent Publication 1: Jornal fur praktische Chemie. Band 312 (1970), pp 240-244

SUMMARY OF THE INVENTION

It is an object of the present invention to provide a silver-containing composition which comprises silver acetonedicarboxylate with a high silver content, provides excellent electrical conductivity and flatness when heated even at a temperature lower than the decomposition temperature of the silver salt for a short time, has excellent adhesivity to a substrate, is capable of being formed into a silver element of a film, line, or the like form, and has high storage stability.

It is another object of the present invention to provide a substrate having a silver element formed thereon which is excellent in electrical conductivity and flatness, excellent also in adhesivity to the substrate, and is in a film, line or the like form.

The present inventors have made intensive researches for achieving the above objects, to find out that a composition containing silver acetonedicarboxylate and an amine of a particular structure gives a silver element having excellent electrical conductivity and flatness as well as excellent adhesivity to a substrate, through heating even at a low temperature for a short time, and that such a composition has excellent storage stability, to thereby complete the present invention.

According to the present invention, there is provided a silver-containing composition comprising silver compound (A) represented by formula (1) and amine compound (B) represented by formula (2):

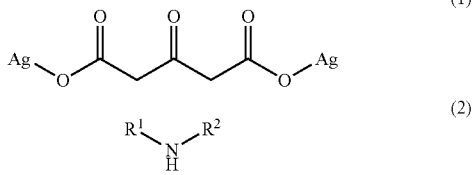

(1)

(2)

wherein $R^1$ is a hydrogen atom, —$(CY_2)$a-$CH_3$, or —$((CH_2)$b-O—CHZ)c-$CH_3$, $R^2$ is —$(CY_2)$d-$CH_3$ or —$((CH_2)$e-O—CHZ)f-$CH_3$, wherein Y is a hydrogen atom or —$(CH_2)$g-$CH_3$, and Z is a hydrogen atom or —$(CH_2)$h-$CH_3$, a is an integer of 0 to 8, b is an integer of 1 to 4, c is an integer of 1 to 3, d is an integer of 1 to 8, e is an integer of 1 to 4, f is an integer of 1 to 3, g is an integer of 1 to 3, and h is an integer of 1 to 2, wherein a content of said silver component (A) is 10 to 50 mass % and a content of said amine compound (B) is 50 to 90 mass %, with respect to a total of 100 mass % of said silver compound (A) and said amine compound (B).

According to the present invention, there is also provided a substrate having a silver element formed thereon, said silver element having been formed by applying the silver-containing composition on a substrate, and heating said substrate to form a silver element.

The silver-containing composition according to the present invention, which contains the silver compound (A) and the amine compound (B) at a particular ratio, may have, for example, an increased silver concentration, and may provide a silver element quickly in the absence of a catalyst even at a lower temperature of 150° C. or lower. As the formation of a silver element at a lower temperature is realized, formation of a silver element, for example, on a resin substrate of low heat resistance is, in turn, realized in a short time. Further, at a higher temperature of 150° C. or higher, formation of a silver element instill a shorter time is realized, which leads to expectation of improvement in productivity. The silver element in the form of a film or a line thus obtained is excellent in flatness and electrical conductivity as well as adhesivity to a substrate, so that the element may be expected to be used in various fields, such as wiring or reflective materials.

PREFERRED EMBODIMENTS OF THE INVENTION

Figure 1:
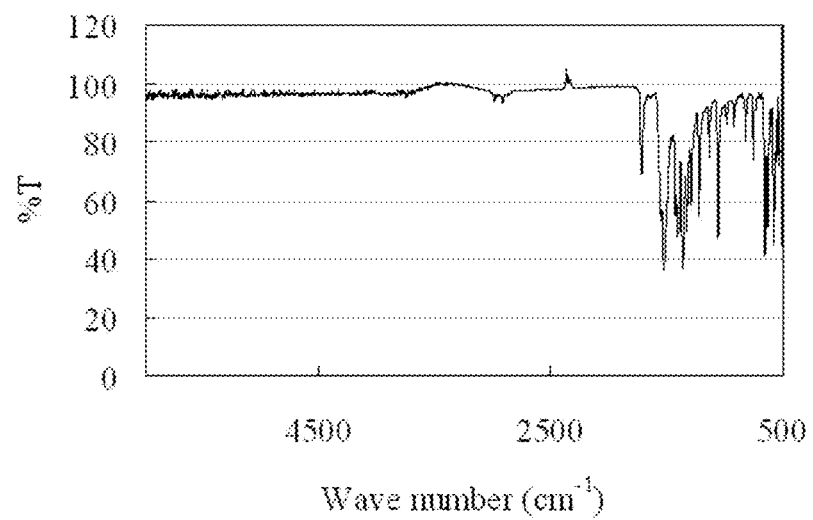
FIG. 1 shows infrared spectra of the silver acetonedicarboxylate prepared in Synthesis Example 1.

The present invention will now be explained in detail.

The silver-containing composition according to the present invention contains silver compound (A) represented by formula (1) above and amine compound (B) represented by formula (2) above at a particular ratio.

The silver compound (A) is silver acetonedicarboxylate, and is usually in the form of powder. The silver compound (A) is known as a material which gives a high viscosity when diluted with a solvent, and is hard to be patterned, such as in printing. However, by combining the silver compound (A) with the amine compound (B), the viscosity of a resulting composition with even a high silver content may be made low.

As the silver compound (A) alone has a high decomposition temperature, formation of silver metal by sintering at not higher than 150° C. requires a long time. However, by combining the silver compound (A) with the amine compound (B), silver metal may be formed by sintering at a lower temperature of 150° C. or lower in a short time. Further, it has been revealed that, by the synergetic effect of the silver compound (A) and the amine compound (B), good dispersibility of the silver compound (A) is maintained for a longer time, and the storage stability is significantly improved, compared to a composition containing other silver carboxylate.

In the silver-containing composition according to the present invention, the content of the silver compound (A) is 10 to 50 mass %, and the content of the amine compound (B) is 50 to 90 mass %, with respect to a total of 100 mass % of the silver compound (A) and the amine compound (B). When it is desired to increase the silver concentration of the composition, the content of the amine compound (B) is preferably 50 to 70 mass %. With less than 50 mass % of the amine compound (B), the solubility of the silver compound (A) is extremely low.

The silver compound (A), which is silver acetonedicarboxylate, used in the present invention may be prepared by any process without limitation. For example, the method disclosed in Non-patent Publication 1 mentioned above may be employed. Specifically, when the silver acetonedicarboxylate is prepared with a basic substance, an organic base is preferred for avoiding contamination by metal ions.

The amine compound (B) used in the present invention is represented by formula (2) above, wherein $R^1$ is a hydrogen atom, —$(CY_2)$a-$CH_3$, or —$((CH_2)$b-O—CHZ)c-$CH_3$, $R^2$ is, —$(CY_2)$d-$CH_3$—, or —$((CH_2)$e-O—CHZ)f-$CH_3$, wherein Y is a hydrogen atom or —$(CH_2)$g-$CH_3$, and Z is a hydrogen atom or —$(CH_2)$h-$CH_3$, a is an integer of 0 to 8, b is an integer of 1 to 4, c is an integer of 1 to 3, d is an integer of 1 to 8, e is an integer of 1 to 4, f is an integer of 1 to 3, g is an integer of 1 to 3, and h is an integer of 1 to 2.

The amine compound (B) may be, for example, ethylamine, 1-propylamine, 1-butylamine, 1-pentylamine, 1-hexylamine, 1-heptylamine, 1-octylamine, isopropylamine, isobutylamine, isopentylamine, sec-butylamine, tert-butylamine, tert-amylamine, 3-methoxypropylamine, 2-ethoxypropylamine, 3-isopropoxypropylamine, diisopropylamine, or dibutylamine. One or a mixture of two or more of these may be used.

Application of the composition of the present invention to, for example, a reflective electrode, which is required to have light reflectivity, calls for a still higher flatness (smoothness) of the resulting silver element in a film form. For such application, in formula (2) representing the amine compound (B), $R^1$ is preferably a hydrogen atom, —($CY_2$)a-$CH_3$, or —(($CH_2$)b-O—CHZ)c-$CH_3$, wherein it is particularly preferred that Y and Z each is a hydrogen atom or a methyl group, a is an integer of 2 to 6, b is an integer of 1 to 3, and cis 1 or 2. Similarly, $R^2$ is preferably —($CY_2$)d-$CH_3$ or —(($CH_2$)e-O—CHZ)f-$CH_3$, wherein it is preferred that Y and Z each is a hydrogen atom, d is an integer of 1 to 6, e is an integer of 1 to 3, and f is an integer of 1 to 2.

For imparting low-temperature sintering at lower than 150° C. to a composition of the present invention, it is more preferred to use amine compound (B) having a boiling point of lower than 130° C. Such amine compound (B) may preferably be, for example, one or more of 1-propylamine, 1-butylamine, 1-pentylamine, 1-hexylamine, 1-heptylamine, 1-octylamine, isopropylamine, isobutylamine, isopentylamine, 3-methoxypropylamine, 2-ethoxypropylamine, 3-isopropoxypropylamine, diisopropylamine, and dibutylamine.

The composition according to the present invention may optionally contain, in addition to the silver compound (A) and the amine compound (B), a solvent for the purpose of improvement in printability on a substrate or viscosity adjustment. The amount of the solvent to be used is preferably 20 to 80 mass %, more preferably 40 to 60 mass %, with respect to a total of 100 mass % of the silver compound (A), the amine compound (B), and the solvent. With more than 80 mass % of the solvent, a uniform silver element may not result due to a reduced silver content.

The solvent is not particularly limited, and is preferably easy to remove during formation of a silver element. One or a mixture of solvents may be used according to the application. The solvent may be, for example, one or a mixture of two or more of alcohols, such as methanol, ethanol, 1-propanol, 2-propanol, 1-butanol, 2-butanol, tert-butanol, 1-pentanol, 2-pentanol, 3-pentanol, tert-amyl alcohol, ethylene glycol, butoxyethanol, methoxyethanol, ethoxyethanol, propylene glycol, propylene glycol monomethyl ether, propylene glycol monopropyl ether, propylene glycol monobutyl ether, and dipropylene glycol monomethyl ether; ethers, such as acetoxymethoxy propane, phenylglycidylether, and ethylene glycol glycidyl; ketones, such as acetone, methyl ethyl ketone, and methyl isobutyl ketone; nitriles, such as acetonitrile, propionitrile, butyronitrile, and isobutyronitrile; sulfoxides, such as dimethyl sulfoxide; water; and 1-methyl-2-pyrrolidone.

A solvent preferred for higher flatness of the resulting silver element and lower heat treatment temperature in the formation of the silver element may be, for example, one or a mixture of two or more of ethanol, 1-propanol, 2-propanol, 1-butanol, 2-butanol, 1-pentanol, tert-amyl alcohol, ethylene glycol, butoxyethanol, methoxyethanol, ethoxyethanol, propylene glycol, propylene glycol monomethyl ether, propylene glycol monopropyl ether, propylene glycol monobutyl ether, dipropylene glycol monomethyl ether, methyl ethyl ketone, methyl isobutyl ketone, acetonitrile, propionitrile, butyronitrile, and isobutyronitrile.

When the solvent is used, the order of mixing the components is not particularly limited, and any process may be employed, such as admixing a solvent with a mixture of the silver compound (A) and the amine compound (B), admixing the silver compound (A) with a mixture of the amine compound (B) and the solvent, or admixing the amine compound (B) with a mixture of the silver compound (A) and the solvent.

The composition of the present invent ion may optionally contain, as necessary, for example, hydrocarbon, acetylene alcohol, or silicone oil for adjusting the levelling property on a substrate, or for example, resin or a plasticizer for adjusting the viscosity characteristics of the composition. The present composition may optionally contain further for example, other electrically conductive powder, glass powder, surfactants, metal salts, and other additives generally used in a silver-containing composition, as necessary.

For further reduction of the sintering time, the composition of the present invention may be warmed in advance, and acted on by a commonly known reducing agent to give a silver colloidal dispersion wherein silver clusters and nanoparticles are formed. The reducing agent may be, for example, borohydrides, tertiary amines, thiol compounds, phosphorus compounds, ascorbic acid, quinones, and phenols. The amount of the reducing agent may suitably be selected as long as the electrical conductivity and the flatness of the resulting silver element is not impaired.

The substrate having a silver element formed thereon according to the present invention is a substrate, such as a base plate, having a silver element formed thereon by applying the present composition on the substrate, and heating the substrate to form silver metal into a film-or line-shaped silver element.

The material of the substrate to which the present composition is to be applied is not particularly limited, and may be, for example, glass, silicone, polyimide, polyester, or polycarbonate. In view of the productivity, flexible resins that are recognized as suitable for various printing, such as polyester, are preferred.

The composition of the present invention may be applied to a substrate by, for example, printing. The temperature at which the substrate is heat-treated is not particularly limited as long as it is not lower than room temperature. In view of the productivity, heating at not lower than 80° C. is preferred for short-time sintering. In particular, for forming a silver element in a film or line form on a substrate of a resin having a low heat resistance, such as polyesters including PET, or polycarbonates, the heat treatment is preferably carried out at not lower than 80° C. and lower than 150° C. When a substrate having excellent heat resistance is used, the heat treatment is preferably carried out at not lower than 120° C. and lower than 170° C. in view of the productivity.

EXAMPLES

The present invention will now be explained with reference to Examples, which are not intended to limit the present invention.

Synthesis Example 1

Synthesis of Silver acetonedicarboxylate (Silver Salt A)

Into a 1000 ml beaker, 43.8 g of acetonedicarboxylic acid was measured out, added and dissolved into 600 g of ion-exchanged water, and ice-cooled. In the resulting solution, 102 g of silver nitrate was dissolved, and then 48 g of hexylamine was introduced and stirred for 30 minutes. The obtained white solid was separated by filtration, washed with acetone, and vacuum-dried to obtain 88.2 g of silver acetonedicarboxylate (abbreviated as silver salt A hereinbelow) in the form of a white solid. The yield was 82%. The infrared spectrum of the obtained silver salt A is shown in FIG. 1.

IR: 1372.10 $cm^{-1}$, 1581.34 $cm^{-1}$

Figure 2:
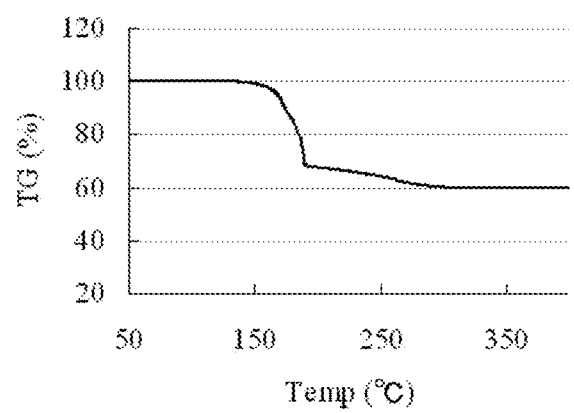
FIG. 2 is a graph showing the result of the thermogravimetric analysis of the silver acetonedicarboxylate prepared in Synthesis Example 1.
Figure 3:
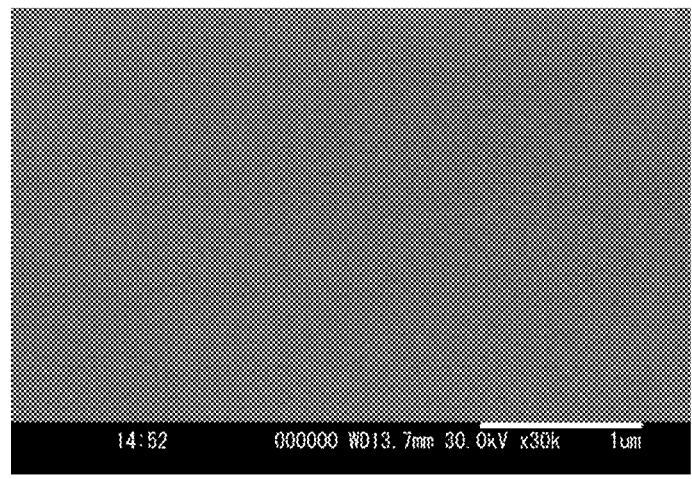
FIG. 3 a photocopy of a SEM image of the silver film formed from the ink solution prepared in Example 2-1.
Figure 4:
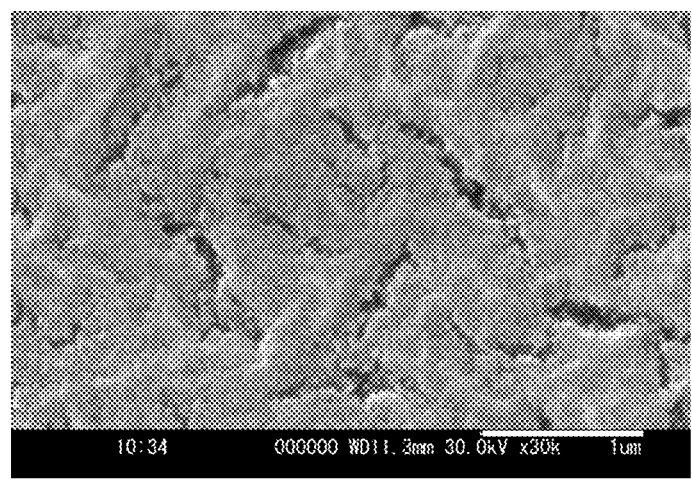
FIG. 4 is a photocopy of a SEM image of the silver film formed from the ink solution prepared in Comparative Example 2-2.

The obtained silver salt A was subjected to TGA in a thermogravimetric analyzer (manufactured by SII NANO-TECHNOLOGY INC.). The analysis was carried out at a rate of 10° C./min of temperature increase, and the measurement was made in the atmospheric air. As a result, the thermal decomposition temperature was found to be 175° C. The residue after the thermogravimetric analysis was 59.7%, which was consistent with the theoretical residual ratio (59.4%). The result of the analysis is shown in FIG. 2.

Example 1-1

In a light-resistant bottle, 200 mg of silver salt A prepared in Synthesis Example 1 was dissolved into 800 mg of hexylamine (HA) to obtain a silver-containing composition. The composition is shown in Table 1.

Examples 1-2 to 1-6

In a light-resistant bottle, silver salt A prepared in Synthesis Example 1 was dissolved into amine compound (B) at a composition shown in Table 1 to obtain a silver-containing composition. The composition is shown in Table 1.

In the table, BA is an abbreviation for butylamine, PA for propylamine, DBA for dibutylamine, and 2-EOEA for 2-ethoxyethylamine.

Comparative Examples 1-1 to 1-4

In a light-resistant bottle, a silver salt was dissolved in amine compound (B) at a composition shown in Table 1 to obtain a silver-containing composition. The composition is shown in Table 1.

TABLE 1

| | Silver salt | | Amine compound (B) mg mass % | | | | |
|---|---|---|---|---|---|---|---|
| | Kind of silver salt | mg (mass %) | HA | BA | PA | DBA | 2-EOEA |
| Example 1-1 | Silver salt A | 200 20 | 800 80 | | | | |
| Example 1-2 | Silver salt A | 400 40 | 600 60 | | | | |
| Example 1-3 | Silver salt A | 400 40 | | 600 60 | | | |
| Example 1-4 | Silver salt A | 400 40 | | | 600 60 | | |
| Example 1-5 | Silver salt A | 400 40 | | | | 600 60 | |
| Example 1-6 | Silver salt A | 400 40 | | | | | 600 60 |
| Comp. Ex 1-1 | Malonic acid | 200 20 | 800 80 | | | | |
| Comp. Ex 1-2 | Silver α-methyl-acetoacetate | 200 20 | 800 80 | | | | |
| Comp. Ex 1-3 | Silver stearate | 200 20 | 800 80 | | | | |
| Comp. Ex 1-4 | Silver glyoxylate | 200 20 | 800 80 | | | | |

Example 2-1

In a light-resistant bottle, 800 mg of a silver-containing composition obtained in Example 1-1 was added to and mixed with 200 mg of isopropyl alcohol (IPA) to prepare a silver-containing ink solution.

Examples 2-2 to 2-9

In a light-resistant bottle, a silver-containing solution prepared in each of Examples 1-2 to 1-6 was added to and mixed with each solvent at a composition shown in Table 2 to prepare a silver-containing ink solution.

In the table, PMG is an abbreviation for propylene glycol monomethyl ether, n-HA for n-hexyl alcohol, and TAA for tert-amyl alcohol.

Comparative Examples 2-1 to 2-4

A silver-containing composition of 800 mg containing silver salt prepared in each of Comparative Examples 1-1 to 1-4 was added to and mixed with 200 mg of IPA to prepare a silver-containing ink solution.

Experimental Example

The composition of each solution prepared in Examples 2-1 to 2-9 and Comparative Example 2-1 to 2-4 is shown in Table 2, and the stability of each solution when left to stand at room temperature for 2 weeks was confirmed by the presence/absence of precipitation. The results are shown in Table 3.

The solutions were graded according to state of the precipitation as A when no precipitation was observed, as B when slight precipitation was observed, and as C when a large amount of precipitation was observed. Grades A and B achieve the effects of the present invention.

Further, each of the solutions prepared in Examples 1-1 to 1-6, Examples 2-1 to 2-9, Comparative Examples 1-1 to 1-4, and Comparative Examples 2-1 to 2-4 was applied to a polyethylene terephthalate film with Select-Roller (manufactured by OSG SYSTEM PRODUCTS CO., LTD), and heat-treated at 100° C. for 30 minutes. Each of the solutions prepared in Example 1-2 and Example 2-2 was heat-treated also at 80° C. for 90 minutes, separately. The appearance of the obtained film was visually evaluated. The results are shown in Table 4.

The obtained films were also subjected to evaluation of the electrical conductivity by means of a four-point probe resistivity meter (LORESTA GP manufactured by MITSUBISHI CHEMICAL CORPORATION). The results are shown in Table 4. Here, the volume resistivity of not higher than $5.0 \times 10^{-5}$ Ω·cm achieves the effects of the present invention, and O.L. stands for "over the limit".

A SEM image of each of the obtained films was taken, and the flatness of the film was evaluated. The results are shown in Table 4.

The flatness was graded as A when no gap of less than 50 nm was observed, as B when a gap of not less than 50 nm and less than 100 nm was observed, as C when a gap of not less than 100 nm and less than 200 nm was observed, and as D when a gap of not less than 200 nm was observed and the silver film has no gloss. Grades A and B achieve the effects of the present invention.

The adhesivity of the film to the substrate was evaluated by adhering an adhesive tape to the obtained film and then peeling the same from the substrate. The results are shown in Table 4.

The adhesivity was graded as A when no flaking was observed, as B when partial flaking was observed, and as C when all the film was flaked. Grades A and B achieve the effects of the present invention.

TABLE 2

| | Silver salt solution | | Solvent | | | |
|---|---|---|---|---|---|---|
| | Kind of solution | mg (mass %) | IPA mg | PGM mass % | n-HA | TAA |
| Example 2-1 | Example 1-1 | 800 80 | 200 20 | | | |
| Example 2-2 | Example 1-2 | 400 40 | 600 60 | | | |
| Example 2-3 | Example 1-3 | 400 40 | 600 60 | | | |
| Example 2-4 | Example 1-4 | 400 40 | 600 60 | | | |
| Example 2-5 | Example 1-5 | 400 40 | 600 60 | | | |
| Example 2-6 | Example 1-6 | 400 40 | 600 60 | | | |
| Example 2-7 | Example 1-2 | 400 40 | | 600 60 | | |
| Example 2-8 | Example 1-2 | 400 40 | | | 600 60 | |
| Example 2-9 | Example 1-2 | 400 40 | | | | 600 60 |
| Comp. Ex 2-1 | Comp. Ex. 1-1 | 800 80 | 200 20 | | | |
| Comp. Ex 2-2 | Comp. Ex. 1-2 | 800 80 | 200 20 | | | |
| Comp. Ex 2-3 | Comp. Ex. 1-3 | 800 80 | 200 20 | | | |
| Comp. Ex 2-4 | Comp. Ex. 1-4 | 800 80 | 200 20 | | | |

TABLE 3

| Kind of ink | Storage stability |
|---|---|
| Example 2-1 | A |
| Example 2-2 | A |
| Example 2-3 | A |
| Example 2-4 | A |
| Example 2-5 | B |
| Example 2-6 | A |
| Example 2-7 | A |
| Example 2-8 | A |
| Example 2-9 | A |
| Comp. Ex. 2-1 | A |
| Comp. Ex. 2-2 | C |
| Comp. Ex. 2-3 | A |
| Comp. Ex. 2-4 | A |

TABLE 4

| Kind of ink | Conditions of heating Temp. (° C.) | Hour | Appearance of film | Volume resistivity (×10⁻⁵ Ω·cm) | Flatness | Adhesivity |
|---|---|---|---|---|---|---|
| Example 1-1 | 100 | 30 | Silver | 1.5 | A | B |
| Example 1-2 | 100 | 30 | Silver | 1.8 | A | B |
| Example 1-3 | 100 | 30 | Silver | 2.6 | A | B |
| Example 1-4 | 100 | 30 | Silver | 4.0 | B | B |
| Example 1-5 | 100 | 30 | Silver | 4.4 | B | C |
| Example 1-6 | 100 | 30 | Silver | 2.7 | A | B |
| Example 2-1 | 100 | 30 | Silver | 1.2 | A | B |
| Example 2-2 | 100 | 30 | Silver | 1.6 | A | B |
| Example 2-3 | 100 | 30 | Silver | 2.0 | A | B |
| Example 2-4 | 100 | 30 | Silver | 3.2 | B | B |
| Example 2-5 | 100 | 30 | Silver | 4.3 | B | C |
| Example 2-6 | 100 | 30 | Silver | 2.9 | A | B |
| Example 2-7 | 100 | 30 | Silver | 2.5 | A | B |
| Example 2-8 | 100 | 30 | Silver | 2.8 | A | C |
| Example 2-9 | 100 | 30 | Silver | 2.4 | A | B |
| Example 1-2 | 80 | 90 | Silver | 3.5 | A | C |
| Example 2-2 | 80 | 90 | Silver | 3.6 | A | B |
| Comp. Ex. 1-1 | 100 | 30 | Gray, spotted | O.L | D | D |
| Comp. Ex. 1-2 | 100 | 30 | Gray | O.L. | C | D |
| Comp. Ex. 1-3 | 100 | 30 | Brown, spotted | O.L. | D | D |
| Comp. Ex. 1-4 | 100 | 30 | Brown, spotted | O.L. | D | D |
| Comp. Ex. 2-1 | 100 | 30 | Gray, spotted | O.L. | D | D |
| Comp. Ex. 2-2 | 100 | 30 | Gray | O.L. | C | D |
| Comp. Ex. 2-3 | 100 | 30 | Brown, spotted | O.L. | D | D |
| Comp. Ex. 2-4 | 100 | 30 | Brown, spotted | O.L. | D | D |

What is claimed is:

1. A silver-containing composition comprising a silver compound (A) of the following formula (1) and an amine compound (B) of the following formula (2):

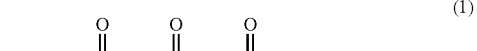

(1)

(2)

wherein $R^1$ is a hydrogen atom, —$(CY_2)a$-$CH_3$, or —$((CH_2)b$-O—$CHZ)c$-$CH_3$, $R^2$ is —$(CY_2)d$-$CH_3$ or —$((CH_2)e$-O—$CHZ)f$-$CH_3$, wherein Y is a hydrogen atom or —$(CH_2)g$-$CH_3$, and Z is a hydrogen atom or —$(CH_2)h$-$CH_3$, a is an integer of 0 to 8, b is an integer of 1 to 4, c is an integer of 1 to 3, d is an integer of 1 to 8, e is an integer of 1 to 4, f is an integer of 1 to 3, g is an integer of 1 to 3, and h is an integer of 1 to 2, wherein a content of said silver component (A) is 10 to 50 mass % and a content of said amine compound (B) is 50 to 90 mass %, with respect to a total of 100 mass % of said silver compound (A) and said amine compound (B).

2. The silver-containing composition according to claim 1, wherein said composition comprises 20 to 80 mass % of said silver compound (A) and said amine compound (B), and 20 to 80 mass % of a solvent.

3. A substrate having a silver element formed thereon obtained by applying the silver-containing composition of claim 1 on a substrate, and heating the substrate to form a silver element thereon.

4. A substrate having a silver element formed thereon obtained by applying the silver-containing composition of claim 2 on a substrate, and heating the substrate to form a silver element thereon.

* * * * *